United States Patent
De La Puente et al.

(10) Patent No.: US 8,384,410 B1
(45) Date of Patent: Feb. 26, 2013

(54) PARALLEL TEST CIRCUIT WITH ACTIVE DEVICES

(75) Inventors: Edmundo De La Puente, Cupertino, CA (US); David Eskeldson, Colorado Springs, CO (US)

(73) Assignee: Advantest (Singapore) Pte Ltd, Singapore (SG)

( * ) Notice: Subject to any disclaimer, the term of this patent is extended or adjusted under 35 U.S.C. 154(b) by 896 days.

(21) Appl. No.: 12/035,378

(22) Filed: Feb. 21, 2008

Related U.S. Application Data (63) Continuation-in-part of application No. 11/895,512, filed on Aug. 24, 2007, now Pat. No. 7,827,452.

(51) Int. Cl.
*G01R 31/02* (2006.01)

(52) U.S. Cl. .................................. 324/762.02

(58) Field of Classification Search .......... 324/754–765, 324/762.02, 750.3; 714/724–734; 702/120
See application file for complete search history.

(56) References Cited

U.S. PATENT DOCUMENTS

| | | | |
|---|---|---|---|
| 4,497,056 A * | 1/1985 | Sugamori ..................... 714/736 |
| 4,707,654 A * | 11/1987 | Suzuki et al. ................. 324/763 |
| 5,442,643 A * | 8/1995 | Adachi .......................... 714/733 |
| 5,453,991 A * | 9/1995 | Suzuki et al. ................. 714/724 |
| 5,471,481 A | 11/1995 | Okumoto et al. |
| 6,065,144 A | 5/2000 | Knoch |
| 6,275,023 B1 | 8/2001 | Oosaki et al. |
| 6,275,962 B1 | 8/2001 | Fuller et al. |
| 6,281,698 B1 * | 8/2001 | Sugimoto et al. ............. 324/765 |
| 6,349,397 B1 | 2/2002 | Koga et al. |
| 6,392,427 B1 | 5/2002 | Yang |
| 6,480,978 B1 * | 11/2002 | Roy et al. ...................... 714/724 |
| 6,483,338 B2 | 11/2002 | Weng et al. |
| 6,499,121 B1 * | 12/2002 | Roy et al. ...................... 714/724 |
| 6,577,979 B1 * | 6/2003 | Okitaka ......................... 702/117 |
| 7,091,598 B2 | 8/2006 | Fujita et al. |
| 7,395,476 B2 | 7/2008 | Cowell et al. |
| 7,421,632 B2 * | 9/2008 | Jordan et al. ................. 714/724 |
| 7,574,637 B2 * | 8/2009 | Ricchetti et al. ............. 714/724 |
| 7,743,304 B2 * | 6/2010 | Volkerink et al. ............ 714/738 |
| 2003/0155941 A1 * | 8/2003 | Byun et al. ................... 324/765 |
| 2004/0044936 A1 * | 3/2004 | Rearick et al. ............... 714/724 |
| 2006/0018407 A1 | 1/2006 | Osaka et al. |
| 2006/0170453 A1 | 8/2006 | Zerbe et al. |
| 2006/0290361 A1 * | 12/2006 | Ellis et al. .................... 324/713 |
| 2007/0216432 A1 | 9/2007 | Kister |
| 2007/0266288 A1 | 11/2007 | Volkerink et al. |
| 2007/0283197 A1 * | 12/2007 | Jordan et al. ................. 714/724 |
| 2008/0031166 A1 | 2/2008 | Fukuda |

OTHER PUBLICATIONS

International Search Report and Written Opinion for application No. PCT/US2009/034898 mailed on Apr. 7, 2009.
International Search Report and Written Opinion for application No. PCT/US2009/034900, mailed on Apr. 14, 2009.

* cited by examiner

*Primary Examiner* — Arleen M Vazquez
(74) *Attorney, Agent, or Firm* — Holland & Hart LLP

(57) ABSTRACT

In accordance with one embodiment of the invention, a system is provided that comprises a first terminal for receiving an input testing signal during operation; a plurality of input/output terminals coupled with the first terminal; wherein the input/output terminals are configured to parallel output respective output testing signals during parallel output operation; wherein the input/output terminals are configured to parallel input testing response signals during parallel input operation from devices under test; and wherein each of the input/output terminals is electrically isolated during operation from the remaining plurality of input/output terminals.

15 Claims, 11 Drawing Sheets

PARALLEL TEST CIRCUIT WITH ACTIVE DEVICES

CROSS-REFERENCES TO RELATED APPLICATIONS

This application is a continuation-in-part of U.S. patent application Ser. No. 11/895,512, entitled "Error Catch RAM Support Using Fan-Out/Fan-In Matrix", filed on Aug. 24, 2007, now U.S. Pat. No. 7,827,452 which is hereby incorporated by reference in its entirety for all purposes.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND

Test systems often generate signals that can be applied in parallel to multiple devices under test in order to reduce the amount of time needed to test such circuits. Similarly, signals from multiple devices under test can be read in parallel in order to decrease testing time. Different attempts have been made in the past to try to increase parallelism in a test system. Each approach has its benefits and drawbacks. For example, some approaches are: address fan-out using switches, data fan-out using switches, address wire-or, and data wire-or.

Address Fan-Out Using Switches:

One method to increase parallelism has been to take an address drive channel from a tester and connect it to multiple devices using switches (typically mechanical relays) to provide isolation. In most cases the switches sit between the test head and the device under test (DUT) load board or probe card. In some cases they are designed on the probe card itself. Although this approach presents a simple solution, there are multiple drawbacks:

Mechanical relays are bulky and prone to failure. Furthermore, downtime on a system can be a big problem.

In addition, signal performance can be affected in multiple ways. For example, solid state switches have ON resistance and capacitance which will limit the signal performance. This can be tolerated for low frequency testing; however, it is insufficient for high frequency testing. Also, broadcasting a tester signal to multiple DUTs via a transmission line split (assume one pin electronics (PE) line being split into multiple lines) creates severe intrinsic impedance mismatches if the lines are not balanced. Since a PE channel is typically source matched, multiple reflections are seen coming back for the DUTs when this configuration is used. If the branches are balanced (e.g., a 50 ohm line splitting into two 100 ohm lines), then the reflections coming back would cancel out at the split point. The un-balance could occur also if one of the DUTs is not present or if the lines are not length matched. Additionally, it is quite difficult to build high impedance lines using either strip line or micro-strip. To get high impedances either very skinny traces or very thick boards are required. Neither skinny traces nor thick boards are good for manufacturing. Thus, unbalanced lines can be produced in the manufacturing process, which causes an impact on timing accuracy.

If the lines are actually balanced (e.g., a 50 ohm line going into two 100 ohm lines) and one DUT fails. Then, a switch will need to be opened for the failed device. As a result, the 50 ohm line will be going into a single 100 ohm line. This will cause multiple reflections between the DUT and the point where the line splits.

A fanout greater than 2× becomes increasingly difficult due to printed circuit board (PCB) limitations. For example a 4× fanout would require fanning out a single 50 ohm line trace into 4 200 ohm traces. Moreover, testing performance will change as a function of how many DUTs are connected to the fanout lines.

An increase in parallelism does occur with fanout. For example, one could test two 32 pin devices (each having 8 data pins) using 2*8+24=40 pins. In comparison, if there were no address sharing, one would need 64 pins. A net gain of 64/40=1.6 or 60% gain in parallelism.

Data Fan-Out Using Switches:

Another approach to increasing parallelism has been to employ passive switches for data fan-out. Data fan-out produces further complications. Data fan-in/fan-out has the same issues as Address fan-out with the addition of:

Parallelism—When data is shared between DUTs, one needs to be able to independently control each DUT to be able to individually enable their I/O and drive back to the tester. The following net gain in parallelism is achieved. Using the same example as before, to test two 32 pin devices (each having 8 data pins), one would need 33 channels assuming one independent control to serially enable each device for read. A net gain of 64/33=1.94 or 94% gain in parallelism.

Test Time Overhead—Since one needs to read one device at a time, some test time overhead will be incurred. For example if the total read time of a given test program is 30% of the overall test time, then when performing all reads serially, the total test time for four DUT would increase to 0.7 (other)+0.3*2 (reads)=1.3 or 130% test time. Each DUT then causes a 30/2=15% TTO (test time overhead).

Address Wire-OR

Wire-OR configurations can be beneficial in that they require little or no additional circuits on the tester side. On any system in the market, a user can typically implement a wire-OR socket board or probe card. Depending on the desired speed and timing accuracy, a 1:2 or 1:3 or 1:4, etc. could be implemented. Also, there are a couple of variations: one could wire-OR only the driver outputs (Address/Control) and keep the data one to one, or one could wire-OR everything. Wire-OR also has its associated drawbacks.

Electrical Issues—Using a wire-OR configuration on a Tester I/O between multiple devices creates multiple electrical issues. First, it is not possible to isolate a bad device (for example a shorted input would cause all devices tied together to that channel to fail. But, one cannot tell which device is causing the failure.

In wafer sort a bad device would cause other good devices to be marked as bad. And in this case, it is much more difficult to re-test. Therefore, this becomes a yield loss It is also not possible to perform independent parametric testing on each DUT input or I/O in a wired-OR configuration. This is true even if one serializes the tests. Signal Performance—Use of Wired-OR degrades timing performance due to the transmission line sharing by multiple loads. Most if not all device inputs are high impedance. Since most tester's termination method is to use 50 ohm back-matching as soon as one starts driving multiple DUTs with a single tester channel, one will see discontinuities and reflections that depending on the topology might significantly degrade the timing performance of the signals being driven into a DUT (unless the lines are perfectly balanced).

Parallelism—The same analysis as in Address sharing using switches can be applied to a wire-or address configuration.

Test Time Overhead—Test time overhead is not an issue in this case assuming the data is connected one-to-one to the tester channels. Either writing or reading can be done fully in parallel with no TTO (test time overhead).

Data Wire-OR:

Finally, if both address/data are shared, one can achieve the highest parallelism possible. However, there is a cost involved. In addition to the issues of Address only wire-or, the following issues are encountered.

Signal Performance—Since one cannot disconnect other devices, the signal performance when a given DUT is driving back degrades significantly. There are not only impedance mismatches between the DUT and the transmission line, but also, the other DUT(s) act like stubs which will create other reflections on the signal and therefore limited timing accuracy/data rate.

Parallelism—Similar parallelism loss occurs as in the case of data sharing using switches.

Test Time Overhead—Similar test time overhead occurs as in the case of data sharing using switches.

Thus, the methods described above have either performance limitations or electrical limitations. The use of passive switches provides electrical isolation, but not very good performance. On the other hand a driver wire-OR if done properly could have good performance but won't work at wafer sort due to yield issues. Sharing the data lines increases the parallelism but also adds TTO to perform serial reads. The use of wire-OR is limited to a 2× configuration, since any configuration higher than 2× would significantly increase the manufacturing cost of probe cards or socket boards. Thus, there is a very low limit on what can be done with wire-OR. Finally, some of these options are not well suited for high-frequency testing. For example, most applications of address sharing using relays are running frequencies of less than 100 MHz and OTA (Overall Timing Accuracy) of ~1 ns.

Thus, there is a need for a system that will permit improvement in testing devices in parallel so as to overcome at least one of the deficiencies currently present in testing systems.

SUMMARY

In accordance with one embodiment of the invention, a system is provided that comprises a first terminal for receiving an input testing signal during operation; a plurality of input/output terminals coupled with the first terminal; wherein the input/output terminals are configured to parallel output respective output testing signals during parallel output operation; wherein the input/output terminals are configured to parallel input testing response signals during parallel input operation from devices under test; and wherein each of the input/output terminals is electrically isolated during operation from the remaining plurality of input/output terminals.

In accordance with another embodiment of the invention, a method of testing devices can be implemented by providing a testing computer; providing a circuit to be tested; providing a testing channel at the testing computer; and coupling the testing channel with an active fanout integrated circuit so as to fanout the testing channel to a plurality of input/output terminals.

Further embodiments of the invention will be apparent from the description and the figures.

DETAILED DESCRIPTION

In accordance with one embodiment of the invention, a system is provided that will allow one to increase a test system's parallelism. This parallelism can be accomplished while maintaining performance, device isolation, or low test time overhead, each of which can be important for test methodology and COT (cost of test). Furthermore, various benefits can be achieved with different embodiments and different configurations of the test circuits described herein when used in a test setting. Not all of these benefits necessarily need be accomplished by all embodiments of the invention disclosed herein. Some of the benefits that can be gained are for example:

Total isolation from device to device can be achieved in a multi-DUT environment.

Active fan-out can be used to drive multiple DUTs from a single source.

Independent parametric measurements can be performed on each DUT by enabling a path to connect the system PMU. This facilitates measuring specific test circuit parameters that will help determine a DUT condition.

Degradation of a fan-out signal being shared by multiple DUTs can be avoided. In fact, because the fan-out drivers are in close proximity to the DUTs, a signal improvement due to the shorter traces and lower losses can be achieved. A signal can be driven either to one DUT at a time for serial testing or to multiple DUTs in parallel with no degradation.

For read operations, data lines can also share the same tester channels and support the following:

Parallel reads where all DUTs are strobed simultaneously and errors are individually latched. Errors can be used to create conditional branching flags used by the pattern generator.

Parallel reads with ECR support. All DUTs are also strobed simultaneously and data is sent to the ECR (Error Capture RAM) for future redundancy analysis.

A by-pass mode for external functionality can be provided. In this mode, data from a device can be fed directly back to the test system and any compare mode available in the system can be made available to the user.

Modules can be located in close proximity to the DUT. This can be an advantage when a low powered DUT is driving a signal back to the test circuit. Because one configuration of the system can use an active receiver, the overall load to the DUT I/O is significantly reduced which in turn provides a lower noise environment for the devices under test and better performance even with un-terminated DUT signals. Furthermore, the shorter transmission line from the DUT back to the test circuit (rather than all the way back to the probe card of the tester) also lowers the impedance seen by the DUT.

Parallelism is equivalent to a full wire-or of all pins, except there are no electrical and performance issues and also no TTO for reads.

One configuration of the system will support timing accuracies down to about <300 ps even in a full parallel mode. In contrast, a wire-or or switched sharing have a timing accuracy in the 1 ns range for some configurations.

One configuration of the system will support up to 600 Mbs data rates even in the full parallel mode.

Figure 1A:
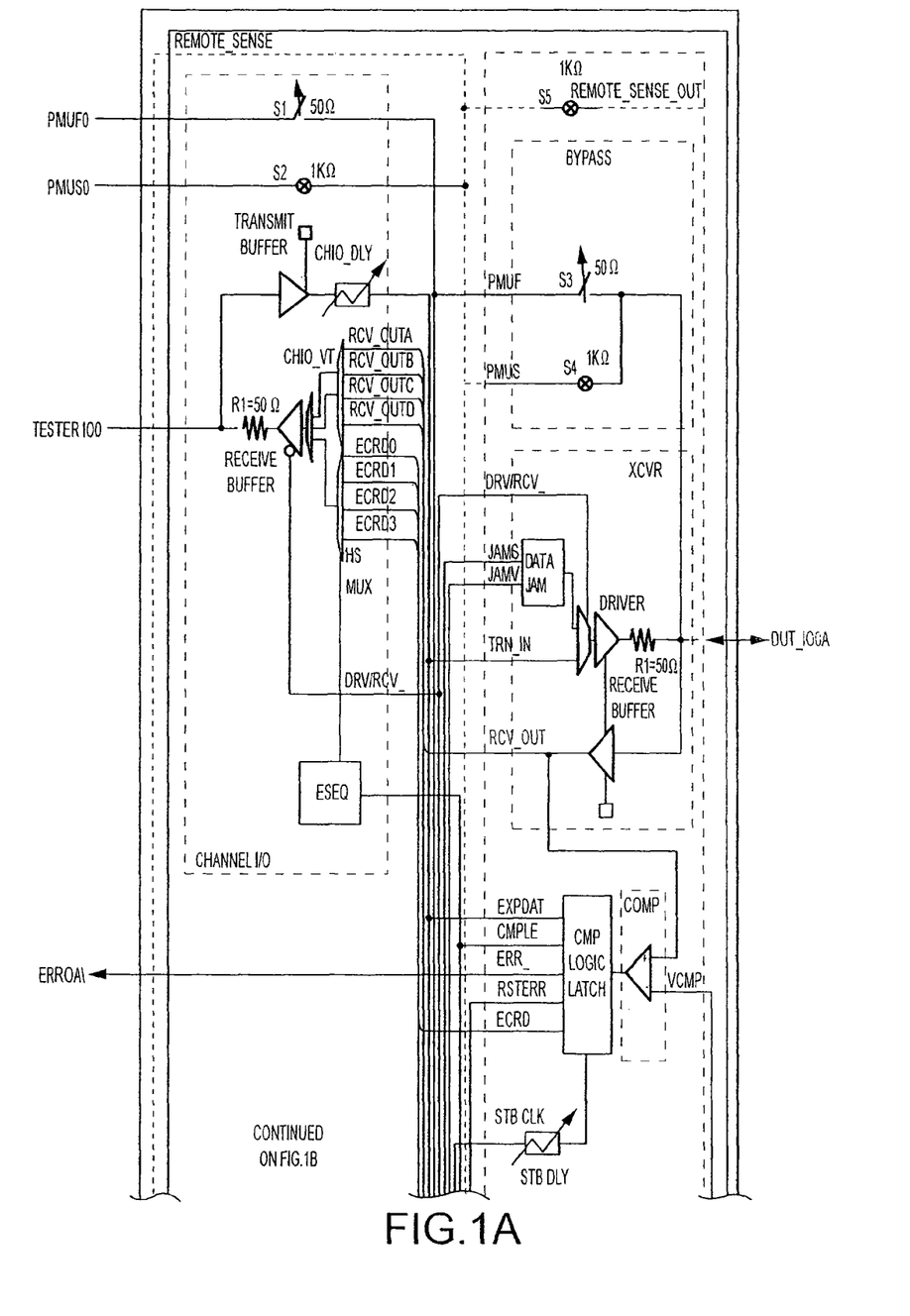
FIGS. 1A, 1B and 1C illustrate a block diagram of a circuit for use in providing active fan-out of test signals in accordance with one embodiment of the invention.
Figure 1B:
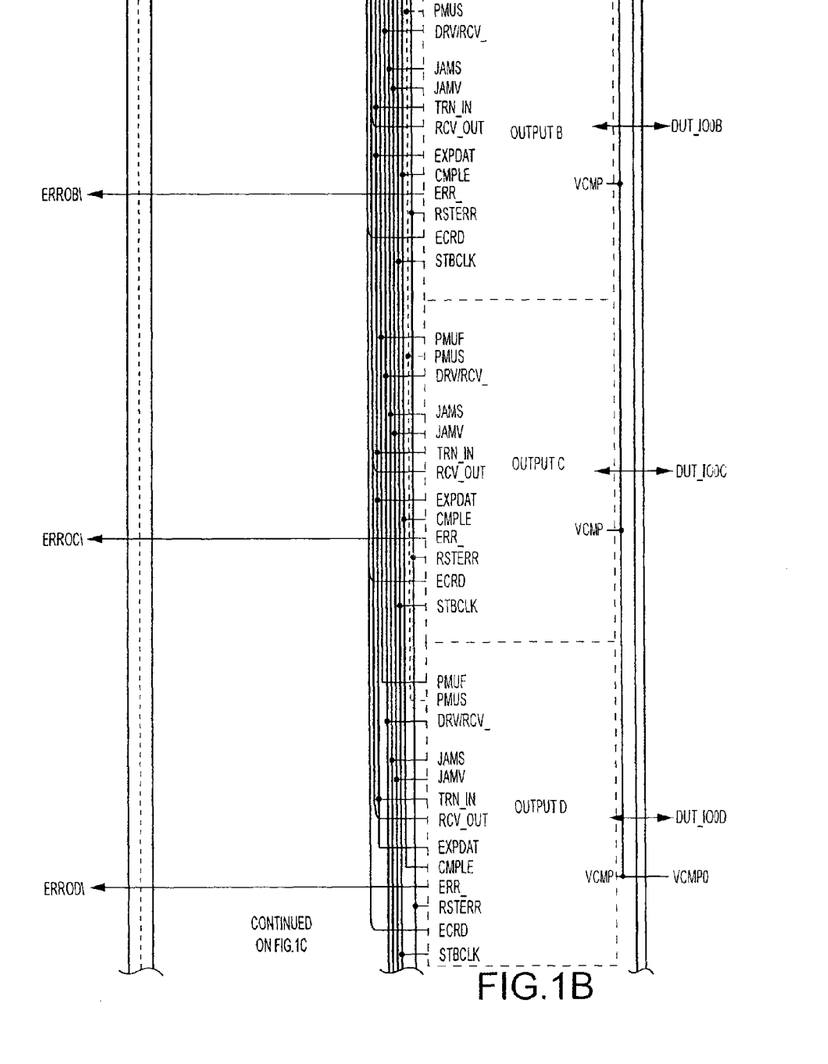

Referring now to FIGS. 1A and 1B, a circuit diagram can be seen for a circuit 100, in accordance with one embodiment of the invention. Circuit 100 can be configured as an application specific integrated circuit. The circuit is shown as having a first channel "Channel 0" and a second channel "Channel 1." Different blocks of Channel 0 are shown in expanded form and are understood to be repeated where indicated in Channel 0. Furthermore, for the sake of simplicity these blocks are not shown in expanded form for Channel 1, but are recognized to parallel the blocks in Channel 0. Channel 0 is shown as producing four output pins: DUT_IO0A, DUT_IO0B, DUT_IO0C, and DUT_IO0D that can be coupled with devices under test. An input pin TESTER IO0 can be coupled with a Tester unit. Circuit 100 shows functional blocks that will be described below. Namely, a transceiver (XCVR) block 104, a comparator block (106), and a Channel I/O block 108 are shown. These functional blocks will be described in more detail below, in accordance with various embodiments of the invention.

Transceiver

Figure 2:
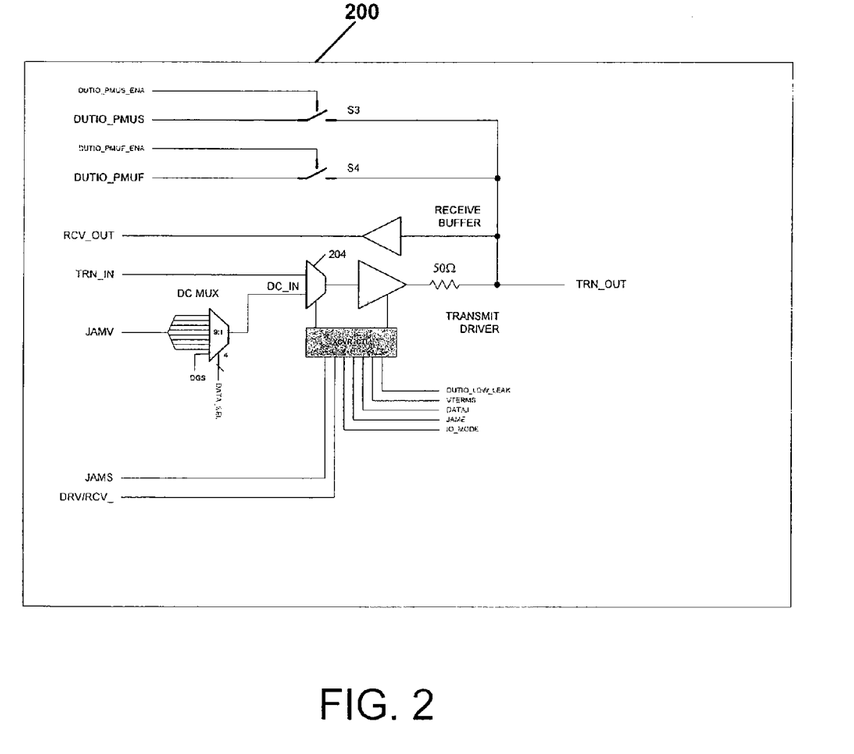
FIG. 2 illustrates a block diagram of a transceiver for use in an active fan-out circuit, in accordance with one embodiment of the invention.

FIGS. 1A and 1B shows an embodiment with four transceiver blocks per channel. FIG. 2 illustrates an embodiment of a transceiver block circuit 200. Each transceiver shown contains a TRANSMIT DRIVER and a RECEIVE BUFFER. The Transmit driver is shown with a 50Ω output resistor. TRN_OUT output will drive off chip where RCV_OUT drives another block inside the chip.

When transmitting a signal from TRN_IN to TRN_OUT, the driver receives the logic level and timing information from TRN_IN and drives out a waveform on TRN_OUT. Because there are no timing adjustment elements in each output, it is beneficial to have a tight propagation delay match among all four transceivers within the channel.

DUT_IO Low Leakage/Disable Mode

The transceiver shown has a disable mechanism by which TRN_OUT goes into a low leakage mode (<5 nA of leakage). This enable/disable feature is controlled using a serial bus bit (DUTIO_LOW_LEAK).

Note that the low leakage mode affects not only the Transmit and Receive buffers, but also the high speed comparator and the CHANNEL_IO transceiver. As shown in FIGS. 1A and 1B, the transceiver is also connected one of the inputs of the comparator. Functionally, the low leakage mode is equivalent of having a switch in front of the 50 ohm output resistor that opens and isolates the Transmit Buffer, Receive Buffer and the high speed comparator from the DUT_IO node.

An independent DUTIO_LOW_LEAK control is provided for each output. This allows disabling only certain outputs. If the output is required to drive a voltage in "jammed mode", then one would not disable the output but instead would select one of the jam modes.

Third Level Termination

Third level termination is controlled by VTERMS. This is a static bit that can be set using the serial bus.

TABLE 1

Third Level Termination Modes

| V TERMS | MODE |
|---|---|
| 0 | VTERM OFF. Transceiver is enabled but third level termination is OFF. If DRV/RCV_ = 0 transceiver is in RECEIVE mode. Transmit Buffer is tri-stated. If DRV/RCV_ = 1 transceiver is in DRIVE mode. TRN_IN is selected to drive out. |
| 1 | VTERM ON. Transceiver is enabled and third level termination is ON. If DRV/RCV_ = 0 transceiver is in RECEIVE mode. DC_IN (VTERM) is selected to drive out the TRANSMIT BUFFER. If DRV/RCV_ = 1 transceiver is in DRIVE mode. TRN_IN is selected to drive out the TRANSMIT BUFFER. |

Direction Control

The transceiver direction is controlled by a separate signal (DRV/RCV_). When DRV/RCV_=0 the transceiver is in receive mode and when DRV/RCV_=1 the transceiver is in transmit mode. When in transmit mode, the Driver drives what is on TRN_IN. The input to the Driver can be selected from multiple sources as it is shown below in the "Transceiver Source Control" section. In transmit mode, the Receive buffer is tri-stated.

When the transceiver is in receive mode, the transmit buffer can either tri-state or drive TRN_IN depending on the termination mode. If third level termination is ON, the transmit buffer continues to drive even in receive mode. If third level termination is OFF, the transmit buffer tri-states. This is explained in the "Third Level Termination" section.

DRV/RCV_ can be an external high speed input as shown in circuit 100. Transitioning from transmit to receive is a high speed operation.

There is one common DRV/RCV_ per chip shown in circuit 100. As shown in the circuit 100, a DRV/RCV_ signal goes through a CLK distribution block which will fan-out the single input to all DUT_IO transceivers.

Also, DRV/RCV_ can be a differential input (+2.5V PECL) and can be distributed internally as a differential pair.

Transceiver Source Control

The Transmit Buffer 204 is shown in FIG. 2 configured to receive two signal sources. Each source can be selected as shown in Table 2 below. The TRN_IN signal is a high speed signal while DC_IN is a DC level. The most critical timing is in TRN_IN and care must be taken to minimize the parasitic load which could degrade the signal.

DC_IN originates from a 9:1 multiplexer. The channel transceivers will use this multiplexer to select between 8 DC voltages plus DGS (ground). These voltages will be common to all four output channels and can be generated off-chip.

TABLE 2

Transceiver Source Control

| DATAJ | JAME | VTERMS | DATA JUM MUX STATE |
|---|---|---|---|
| 0 | 0 | 0 | Normal Transmit Mode. This is the default mode where the TRANSMIT BUFFER is driving and the source is TRN_IN |
| 0 | 0 | 1 | VTERM mode. DRV/RCV_ is a high speed control signal that will toggle between TRN_IN and DC_IN. If DRV/RCV_ = 0 transceiver is in RECEIVE mode. DC_IN is selected to drive out the TRANSMIT BUFFER. If DRV/RCV_ = 1 transceiver is in DRIVE mode. TRN_IN is selected to drive out the TRANSMIT BUFFER. |
| 0 | 1 | X | DC JAM mode. If JAME is asserted, it enables DC JAM mode. If JAMS = 0, TRN IN is selected to drive out the TRANSMIT BUFFER If JAMS = 1, DC_IN is selected to drive out the TRANSMIT BUFFER |
| 1 | X | X | Park Mode: Forces DC_IN out regardless of the other control bits. This is used to park the output to a default voltage when the output is not used |

Three select bits DATA_SEL (3:0) are shown to perform the 9:1 mux selection. These bits are statically controlled using the serial bus. Each DUT_IO output will have an independent DATA_SEL and an independent 9:1 mux. This will allow outputs to be set to different DC voltages for either VTERM mode or for DC JAM mode/Park Modes.

There are four external JAMS signals. Each JAMS signal will be connected to all outputs of the same type (JAMS(0) will be tied to all A outputs, JAMS(1) will be tied to all B outputs, etc.) JAMS is associated with DC JAM mode as shown in Table 2.

There are also individual control bits that will validate the corresponding JAMS signal. For instance if CH0 output A has JAME set while CH1, CH2 and CH3 have JAME not set, then when JAMS(0) goes active, only output 0A will be jammed with its corresponding DC_IN.

Parametric Measurement Unit Connections

Figure 3:
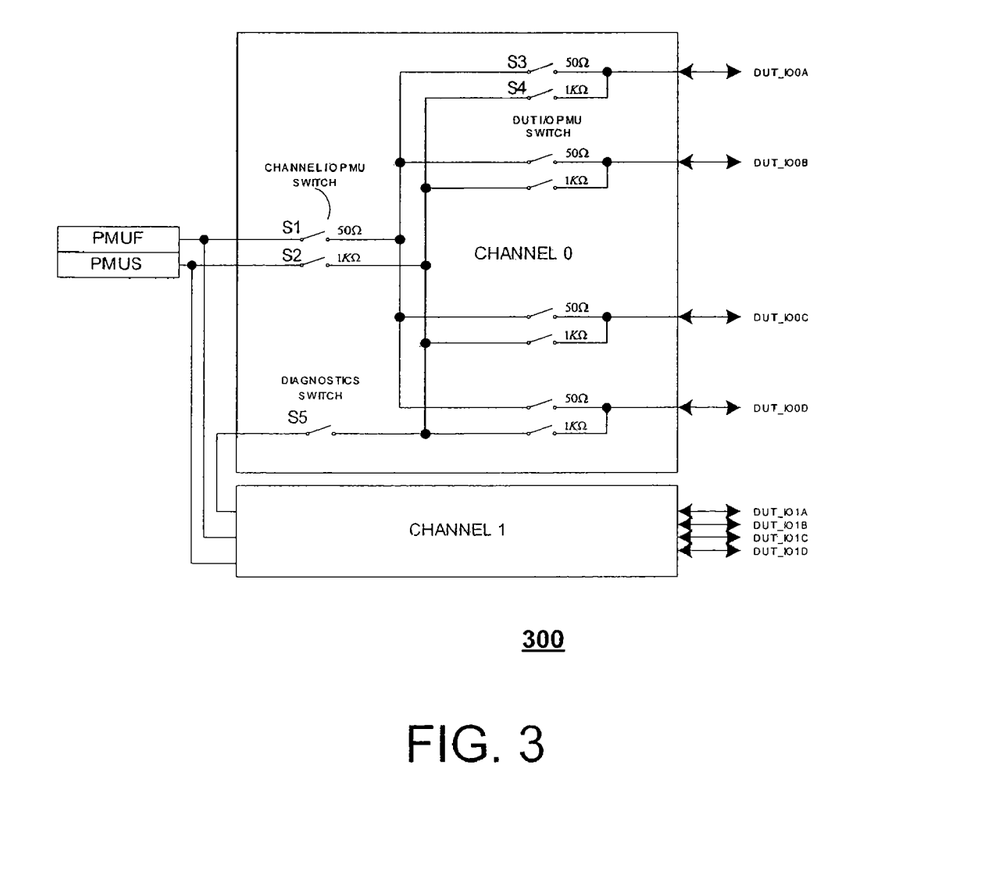
FIG. 3 illustrates a block diagram of a parametric measurement unit circuit in accordance with one embodiment of the invention.

There is a parametric measurement unit (PMU) path available per output as shown in circuit 300 of FIG. 3. The PMUF and the PMUS are external inputs to circuit 100. Circuit 100 is configured so that one pair of pins (PMUF, PMUS for parametric measurement unit force and sense lines, respectively) is shared by both channels of circuit 100.

Each output in circuit 300 is shown containing a pair of switches (S3 and S4) that will connect the internal PMUF and PMUS lines to the output. In addition, there is another pair of switches per channel (51 and S2) that will connect the internal PMUF and PMUS to the external pins. Changing the PMU switch configuration can be accomplished using the serial bus in the circuit.

Comparator

Figure 4:
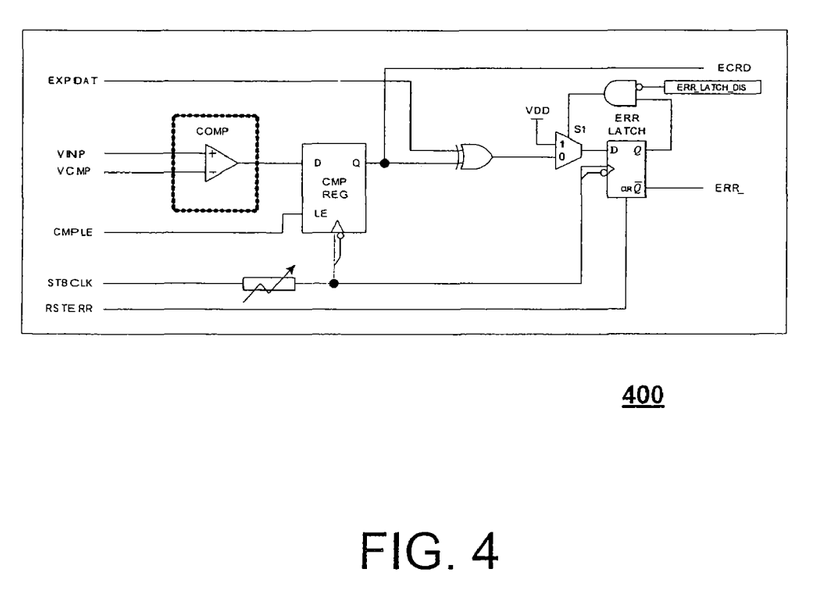
FIG. 4 illustrates a comparator circuit for use in accordance with one embodiment of the invention.

Four comparators can be used for each channel shown in circuit 100. FIG. 4 shows a circuit 400 for use with each comparator. Each comparator can be a high speed comparator where one of the inputs receives a high speed signal while the other is connected to a DC reference voltage. The high speed input should have low capacitance and also should be able to be turned off by the same mechanism that disables the Transceiver.

The output of the comparator shown in circuit 100 does not go off chip, so no output buffers are required. There are only two possible states: Input greater than threshold or less than threshold which will be represented as logic 1 and logic 0.

The output of the comparator does not drive any circuitry remote from circuit 100, so no output buffers are required. There are only two possible states: Input greater than threshold or less than threshold which will be represented as logic 1 and logic 0. The ECRD signal is driven outside the block shown in FIG. 4 and becomes one of the inputs in the high speed digital multiplexer inside the Channel I/O block. STBCLK goes through a fine delay adjustment. The value of this delay line is set using the serial bus and does not need to be updated on-the-fly. STBCLK can be a differential PECL signal with a maximum frequency of 300 MHz. STBCLK can be driven by an internal clock distribution buffer.

Compare Register

Figure 5:
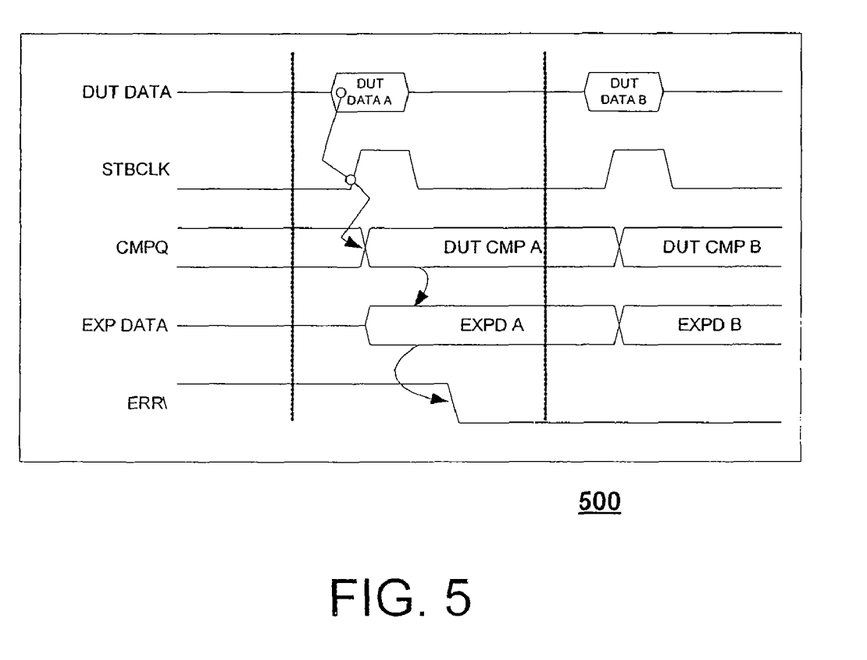
FIG. 5 illustrates an output timing diagram for the ERR\ signal in accordance with one embodiment of the invention.

The main function of the compare register (CMP REG) is to sample the output of the comparator using a delayed version of STBCLK. A latch enable (CMPLE) signal can be used to determine when to sample the input data, as shown by FIG. 5. The clock is not a free running clock, but it will continue to run after CMPLE is de-asserted. CMPLE is internally generated and should maintain synchronization to STBCLK. CMPLE will be active for one STBCLK cycle (5 ns minimum).

The timing accuracy between STBCLK and the actual latching of the output of the level comparator directly contributes to the system's compare accuracy. The assumption is that CMPLE will not contribute to the timing error of this circuit if it is kept out of the way.

Logical Compare

The sampled output (ECRD) drives an XOR gate and performs a logic compare against EXPDAT. FIG. 5 shows a timing diagram which involves ECRD, EXP DATA. Note that in this diagram EXP DATA is shown surrounding STBCLK. This is important since the output of the logic compare will be clocked into the ERR Latch. If the output of the XOR gate is a "1", this will indicate that the ECRD and the EXP DATA do not match. A "1" therefore will indicate a "fail".

ERR Latch

The Error Latch is a "sticky" register. This register will be initially cleared using RSTERR and will drive ERR_ to "1" to indicate a pass. If during the test pattern the logical comparator generates a fail (logic "1"), the ERR LATCH will capture that state and will not allow any new pass or fail states from the XOR gate. It will be possible to disable the ERR Latch sticky mode using ERR_LATCH_DIS. When ERR_LATCH_ DIS is asserted, it will not allow the ERR latch to lock the output when an error is detected. Instead, the output of the CMP REG will be sent out directly. The output of the ERR LATCH is ERR\ which can be an active low signal and indicates a failure when it is set to zero. ERR\ can be driven outside the circuit 100 and in such an instance can use an I/O buffer.

Diagnostics Channel Cross Coupling

Figure 6:
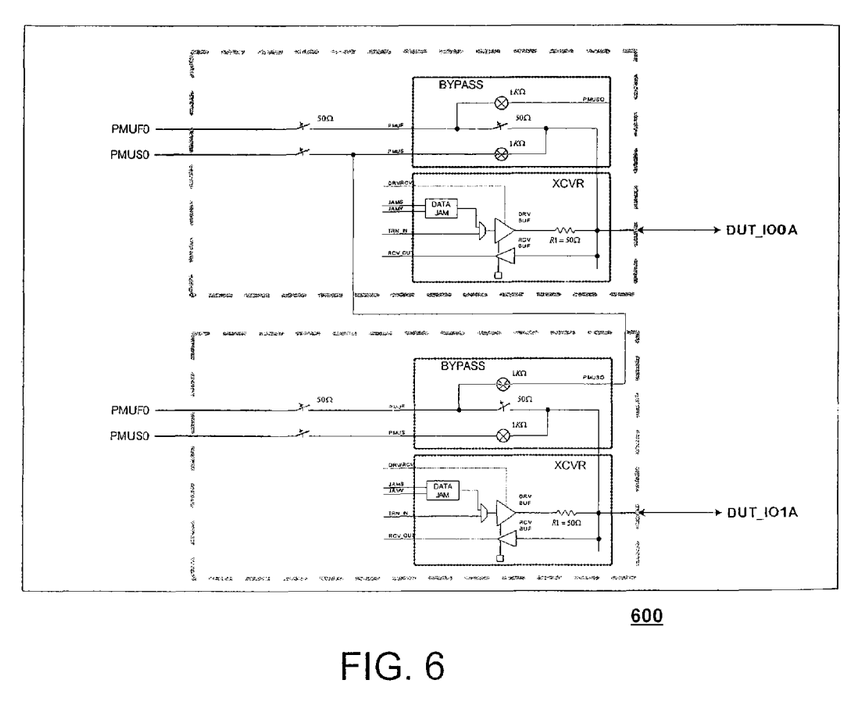
FIG. 6 illustrates a bypass circuit for use in diagnostics cross channel coupling in accordance with one embodiment of the invention.

It is possible to interconnect two outputs either from the same channel or from one channel to another channel using S5, as shown in FIG. 6. This could be useful for running tests across two outputs. The interconnect path may use up to two 1 Kohm switches which will limit the measurements to low speed and low current type measurements.

One example of a test that could be performed is to do a rough functional test on the driver/comparator. If one output from one channel (channel 0 output A) is connected to another output (channel 1 output A), a gross functional test can be performed. In such an instance, a waveform in channel 0 is driven and a compare of this waveform on channel 1 is performed. This test will allow one to easily check for connectivity and basic circuit 100 drive/compare functionality without the need to add any external fixtures. This can be repeated for outputs B, C and D.

Another test example would be to check the PMU interconnectivity. This could be done by connecting the PMU in one channel. In another channel, the comparator or driver could then be used. In either case the PMU could be used to measure or drive a known voltage to the channel and perform a test under these conditions to determine that the correct connections have been made.

Channel Input/Output

Figure 7:
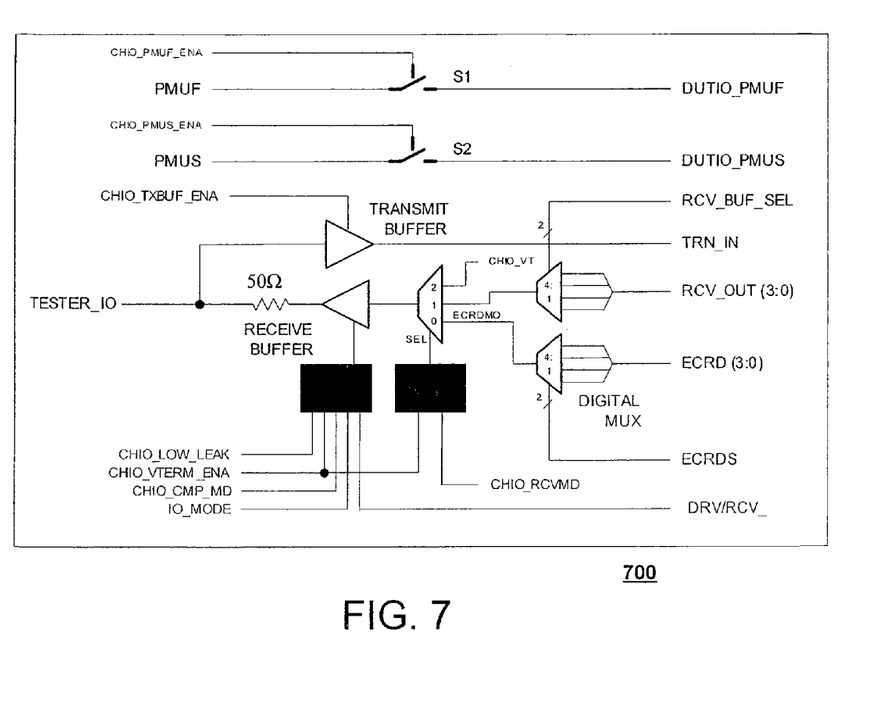
FIG. 7 illustrates a comparator circuit for use in accordance with one embodiment of the invention.

The channel I/O (CHIO) block shown in FIG. 7 is similar to the transceiver block, except that it is shared by multiple DUT_IO outputs. FIGS. 1A and 1B show how the Channel I/O is connected to the DUT_IO blocks.

In accordance with one embodiment, there is one channel I/O block for every four DUT_IO outputs. TRN_OUT interfaces back to the system and uses a TRANSMIT BUFFER to drive a 50 ohm controlled impedance line. There is a built in 50 ohm resistor to back-match the line and to eliminate reflections.

CHIO Receive Buffer State Control

There are three modes supported for the channel I/O: Drive, Receive and Low leakage. Note that the Transmit buffer is controlled separately by CHIO_TXBUF_ENA. This buffer could be ON all the time. The only time when one might want to turn it OFF is when one is in ECRD compare mode to avoid possible feedback.

Drive Mode

A Drive mode is selected by either DRV_RCV\ when in bi-directional mode (IO_MODE=0), or when in Drive only mode (IO_MODE=1). In Drive mode, the transmit buffer receives a signal from the tester via TESTER_IO and buffers it and distributes this signal internally to all DUT_IO drivers. Input termination can be ON or OFF controlled by CHIO_VTERM_ENA. When the termination is enabled, the CHIO Receive Buffer will be turned-on and the RXBUF source will be selected to drive CHIO_VT which is the termination voltage.

Receive Mode

A Receive mode is selected either when DRV_RCV\ is set to "0" in bi-directional mode (IO_MODE=0) or when in compare only mode (IO_MODE=2). The CHIO_VTERM_ENA has no effect in any of the receive modes.

CHIO Receive Buffer State Control

The CHIO Receive Buffer can be turned ON/OFF using CHIO_TXBUF_ENA from the serial bus. This bit is in the CHIO_CTL Register. The CHIO Receive buffer will be ON all the time except when the CHIO transceiver is set to drive ECRD back into the system using TESTER_IO. Even in ECRD mode, one could leave the Receive buffer ON. However this could result in signal feedback through the DUT_IO Transceiver.

Channel IO Low Leakage Mode

The TRN_OUT pin connected to the TRANSMIT BUFFER and the RECEIVE BUFFER can go to low leakage mode by setting the CHIO_LOW_LEAK. Similarly to the DUT_IO transceiver, when CHIO_LOW_LEAK goes active, the overall leakage on that node will go to <5 nA.

The low leakage control for the Channel IO block is a separate bit than the individual DUT_IO bits. This will allow disabling one DUT_IO while maintaining connectivity through the Channel I/O block.

Channel IO Transmit Sources

There are three possible sources for the TRANSMIT BUFFER in the Channel I/O block. The first one is RCV_OUT, the second one is from the ECRD 1:4 digital mux and the third one is from a fixed termination voltage. The selection is controlled by CHIO_RCVMD and CHIO_VTERM_ENA.

Receive Modes

Bypass Mode

By-pass mode is enabled when CHIO_RCVMD is set to "0" and CHIO_VTERM_ENA is also set to "0". When this mode is selected, RCV_OUT is connected through the mux to go into the CHIO TRANSMIT BUFFER and therefore drive the TESTER_IO node.

RCV_OUT as seen in FIGS. 1A and 1B originates in the DUT_IO blocks and is driven by the DUT_IO Receive Buffer. This path can be used when one wants to pass through the DUT output signal directly out to the tester.

Only one DUT_IO at a time can be selected. This provides a serial mode operation to connect one DUT_IO at a time and sequentially go through all DUTs to perform receive operations. The DUT_IO selection can be performed by the RCV_BUF_SEL bits from the serial bus in the CHIO_CTL register. If the implementation is such that all four RCV_OUT from the receive buffers are wired-or, then one would have a single output enable bit from the DUT_IO_CTL register to select which output will drive the CHIO Receive buffer input.

The return path through the RECEIVE BUFFER in the DUT_IO block and the TRANSMIT BUFFER in the Channel I/O block should maintain minimum signal distortion. Both buffers should be high bandwidth unity gain buffers to be able to closely track the input signal at the DUT_IO pin all the way out to the TRN_OUT pin.

ECRD Compare

When performing remote compares using circuit 100 of FIGS. 1A and 1B and also when in ECR mode, the data source for the TRANSMIT BUFFER in the Channel I/O comes from the 4:1 high speed digital ECRD multiplexer. ECRD Compare source is selected when CHIO_RCVMD is equal to "1" and CHIO_VTERM_ENA is set to "0".

The 4:1 high speed digital multiplexer should be able to sustain a 600 Mbs data rate in accordance with one embodiment. Because in one embodiment STBCLK only runs up to 300 MHz, either both edges of the STBCLK should be used to select the multiplexer at 600 Mbs or STBCLK should be used to directly control the LSB address on the multiplexer.

The input signals to the high speed digital multiplexer (ECRD) are originated inside circuit 100 by the DUT_IO blocks as seen in FIGS. 1A and 1B.

A consideration for this path is that in contrast with the TRN_IN path where one needs to maintain signal integrity across (voltage, timing, rise/fall), the ECRD signals are digital in nature and could have a fixed voltage swing (+2.5V PECL). One can provide a clean DATA VALID window when serializing all four data bits such that they can be latched in the system.

Common Blocks

The following blocks are shared by the channel blocks.

CLK Distribution

There are two CLK distribution blocks, STBCLK and DRV_RCV\. Both clocks can be brought into circuit 100 differentially using 2.5V PECL levels.

STBCLK

STBCLK is distributed across the circuit 100 to a total of 8 comparator latches. This clock defines the sample timing for the output of the analog comparator. The STBCLK goes first through a coarse delay line (800 ps span, 114 ps resolution)

which can be used to adjust delay differences in the PC board routing. The STBCLK at the board level can be a single signal that can be distributed to multiple circuits, such as circuit 100. Even if the propagation delays are perfectly balanced, the CLK buffer will have some output to output skews that will need to be compensated for.

The second level of timing control for STBCLK can be local on each DUT_IO block in the comparator section. For example, one can have a 320 ps max delay line with 10 ps resolution that will allow one to further adjust the timing to compensate for internal chip delays in the clock path as well as the comparator delays such that all four outputs in a channel produce the same timing.

This level of adjustment in the STBCLK is useful because the STBCLK originates from a single source and once is distributed to all the different DUT_IO comparators, one needs to be able to de-skew the timing when all circuit 100 inputs see a reference transition.

DRV_RCV\

The DRV_RCV\ signal is also a common signal that can be input to circuit 100 and will be distributed to all DUT_IO transceivers as well as to the CHIO transceiver.

SPI Interface

The circuit 100 communicates with a controller using a standard SPI bus. The SPI bus will send control, address and data that will allow controlling all the different modes and switches. It is estimated that one would need about 18 8 bit registers. The total reconfiguration time target is <1 uS. This includes: serial transfer, decode time, propagation delays as well as opening or closing switches. This interface could use low voltage signaling to improve signal quality.

Modes of Operation

Circuit 100 can be used in a test system to perform the following operations.

By-Pass I/O Mode

In By-pass I/O mode each channel behaves purely as a transceiver. Data in the TESTER_IO line will be driven out to the DUT_IO or vice versa depending on the DRV_RCV\ level. When DRV_RCV\=0 the channel will go to receive mode DUT_IO becomes an input and when DRV_RCV\=1, the channel will go to drive mode and DUT_IO becomes an output. This mode is used when one wants to by-pass the circuit 100 comparator and send the DUT data back to the system comparators. In this mode only one DUT_IO at a time can be connected to the common TESTER_IO line.

By-Pass Receive Only

This is a variation of By-pass I/O mode. In this mode the channel is configured as an input only (DUT_IO->TESTER_IO) and the direction is fixed. Direction on the channel does not get affected by DRV_RCV\. DRV_RCV\ is a common signal on the test board that is coupled with circuit 100. Therefore, one needs to pick which channels need to respond to the DRV_RCV\ control. Some channels one may want to remain in receive mode regardless of the state of DRV_RCV\.

Fan-Out Mode

In fan-out mode circuit 100 only drives out. This is used for sending multiple copies of the TESTER IO input out to multiple DUTs.

Remote Compare with ECR support

Circuit 100 can provide a way to support ERROR logging. For every compare cycle, circuit 100 will serially shift the sampled result of the level comparator (ECRD) back to the system for the actual data compare. Shifting of the data is done between DUT strobes and it occurs in the background.

The high speed digital multiplexer shown in circuit 100 sequences through the sampled ECRD from each DUT_IO section and sends the bits back using the TESTER_IO line. Sequencing of the ECRD is controlled by the internal ECRDS sequencer.

The serial transfer operation occurs in the background between DUT strobe to DUT strobe. The latch only latches the result of the comparator when STBCLK & CMPLE is true. Once this is done, circuit 100 will sequence through all four bits using both edges of STBCLK to send ECRD back to the tester.

ECRDS as shown in FIG. 7 selects which bit is sent out through the high speed digital multiplexer. ECRDS is generated locally in circuit 100 and is synchronized using DRV/RCV_& CHIO_CMP_MD. This is a serial bit that enables read with ECR support. If CHIO_CMP_MD=0 (ECRD Compare) then when DRV/RCV_is =1, the ECRDS sequencer is kept in a reset state (ECRDS=3 or pointing to n–1). As soon as DRV/RCV_ goes to zero, the next STBCLK will clock the ECRDS sequencer to its next state: ECRDS=0 and will continue to clock out 1, 2 and 3 on every transition of STBCLK including negative transitions. When ECRDS=3, this will again enable the CMP REG via CMPLE such that in the next strobe a new set of level detect outputs from the comparator is latched. The sequence then will repeat for every compare cycle.

Remote Compare with PASS/FAIL Only

If ECR support is not required, circuit 100 can be configured to perform a compare operation and to report failures only. This mode can be run at the full system frequency because there is no per compare pass or fail error reporting.

In a READ operation with no ECRD support, it only takes one read cycle to do a compare. Each compare cycle will potentially generate an error, but no ECRD is shipped back to the system.

The TESTER_IO line brings the Expected Data during the compare cycles and the Drive Data during the drive cycles. This represents an advantage in performance given that between the tester and circuit 100 the signal direction does not change from drive to compare. The tester is always driving either drive waveforms or expected data. The transmission path between circuit 100 and the DUT will switch from drive to receive; however, the path is much shorter than the path between the tester and circuit 100. So, it will take much less time to turn the channel around.

STBCLK will define the Read Cycle and latch the errors. The only difference is that the ECRDS bits will not sequence through the multiple error latches. The ECRDS sequencer will be kept in a reset state controlled when CHIO_CMP_MD is a 1 (PASS/FAIL mode). In this mode the comparator register is clocked on every STBCLK transition.

The TESTER_IO timing should be programmed such that it lines up with the CMPQ signals. Since the TESTER_IO signal is generated back at the system (i.e., remote from circuit 100), a system tester can tightly control when this signal changes. This is important because one wants to ensure that there is enough setup and hold time from the actual STBCLK. The only time EXPD needs to be valid is around STBCLK and must be valid by at least the SETUP+HOLD time specs.

Pin Disconnect Mode

In this mode the DUT_IO (circuit 100 output) is put in low leakage mode. This mode is used to either connect the PMUF/PMUS lines to the output, to perform parametric measurements, or to just keep the output from driving any voltage out to the DUT.

Parametric Mode

Parametric mode is used to connect the PMU force and sense lines to the DUT IO node. This is needed to be able to perform parametric measurements on the DUT pins. To set-up parametric mode do the following:

Disable I/O and Jam Mode

This mode allows the user to disable any DUT IO pin and jam it to a desired voltage. Under this mode, the DUT IO does not respond to any of the drive/compare modes and instead its output is forced to the voltage selected in the JAMV mux.

Enable Jam on-the-Fly Mode

Jam output on-the-fly allows the pin to be forced to a pre-selected voltage in the 9:1 mux from the JAMS (Jam Select) inputs. This mode is used to be able to allow an algorithmic pattern generator (APG) to control when a particular output is disabled. The operation requires two conditions to be true: The JAM function must be enabled on the DUT IO and also the corresponding external JAMS bit must become true. If both conditions are true, then the output will be forced to the pre-selected JAMV.

Circuit 100 can be used for a variety of applications in accordance with different embodiments of the invention. For example, applications of circuit 100 include use in a 1:4 Wafer Sort board and a 1:8 Final Test board. These two are very similar in that they can use all the same components and can interface to the same hardware.

Figure 8:
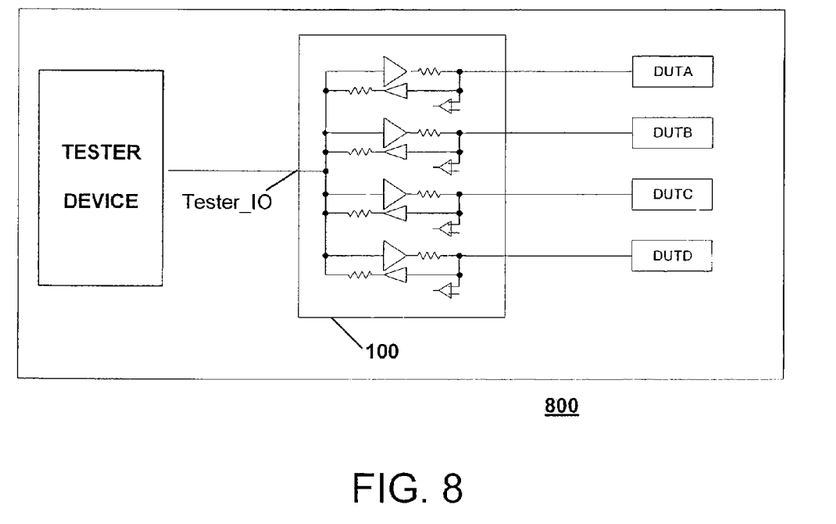
FIG. 8 illustrates an active test circuit in use to provide parallel output and input from multiple devices under test, in accordance with one embodiment of the invention

FIG. 8 shows an example of how circuit 100 could be used in a 1:4 wafer sort. The 1:4 design can use circuit 100 in its native mode where a channel from the tester or tester/probe card is connected to the TESTER_IO pin. Circuit 100 fans this out to four DUTs, as shown in FIG. 8.

In accordance with one embodiment, the TESTER_IO input can be 50 ohm terminated as it is received by circuit 100. This will reduce re-reflections between the tester pin electronics and circuit 100. The Pin Electronics also has a 50 ohm back matched resistor which combined with the 50 ohm input termination in circuit 100 will cause a 50% attenuation on this signal.

In accordance with one embodiment, the four outputs can be time matched in circuit 100 to +/−35 ps. Additionally the four transmission paths going out to the DUTs can be matched to maintain a low skew from output to output.

All modes can be supported in the 1:4 wafer sort configuration. This includes by-pass, remote ECR compare and PASS/FAIL modes.

Figure 9:
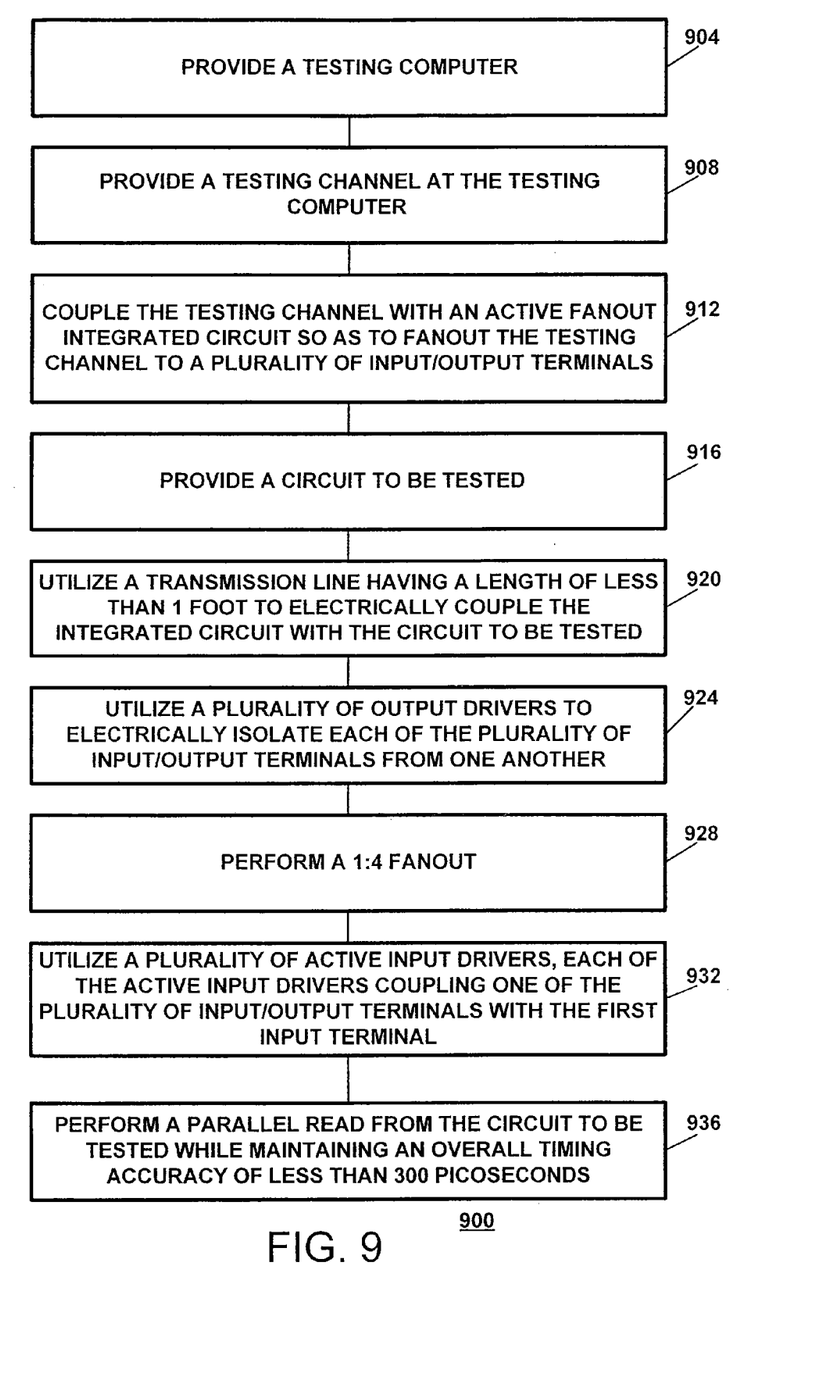
FIG. 9 illustrates a method of testing a circuit in accordance with one embodiment of the invention.

Referring now to FIG. 9, a flowchart 900 illustrates a method of testing a circuit in accordance with one embodiment of the invention. In block 904, a testing computer is provided. This could include a combination of a tester and a probe card that is coupled with the tester. In block 908, a testing channel of the tester is provided. This testing channel can be configured as a pin electronics channel for use in generating test signals. In block 912, the testing channel is coupled with an active fan out integrated circuit. The active fan out allows the testing channel to be fanned out to multiple devices under test. In block 916, at least one circuit to be tested can be provided. In view of the fan out properties of the integrated circuit, however, multiple circuits can be provided for testing in parallel.

Figure 1C:
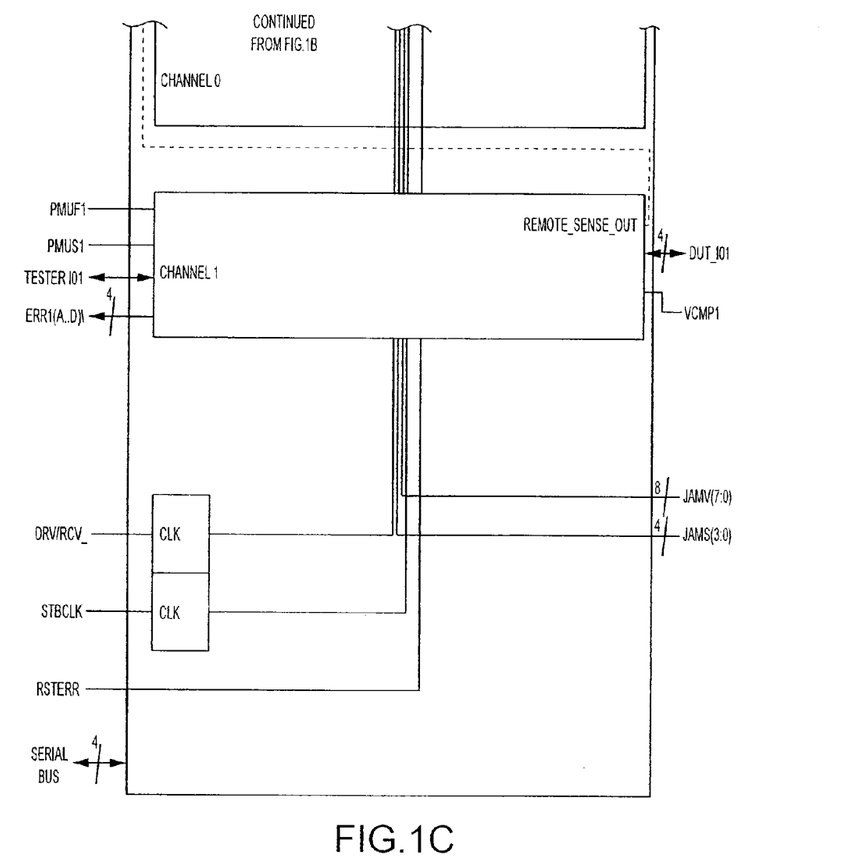

Testing devices and probe cards typically attempt to configure a significant number of test channels for use in testing a significant number of circuits at the same time. However, due to heat dissipation requirements, it is necessary to space out the circuitry used to configure the test channels. As a result, the test channels are often coupled to the circuits under test by a cable having a length of up to three feet or more. This is a significant length for a transmission line for the devices under test. Oftentimes, the devices under test are low power devices that are not configured to drive signals across a three foot cable. Block 920 illustrates that the integrated circuit shown in FIG. 1 can be placed in proximity to a device under test, e.g., within 10-12 inches or less. Furthermore, due to the active nature of the data inputs on the circuit shown in FIG. 1, the DUTs do not need to drive signals over long transmission lines all the way back to the probe card. Rather, they can merely drive the data signals back to the circuit 100 data inputs.

Block 924 illustrates that multiple output drivers in circuit 100 can be electrically isolated from one another. For example, as shown in block 928, the test channel from the tester can be fanned out into 4 subchannels. The isolation can be accomplished by active drivers which exhibit a high input impedance and thus isolate each subchannel from the electrical signals occurring on the other subchannels.

Similarly, block 932 shows that the data inputs can be isolated from one another by using active input drivers on each data input line. Once read in parallel, the data can be serially output through the testing channel.

In accordance with one embodiment of the invention, a parallel read can be accomplished in a 1:4 fanout with a timing accuracy of less than 300 picoseconds. This is in contrast to current circuits which require 1 nanosecond under the same test configuration.

While various embodiments of the invention have been described as methods or apparatus for implementing the invention, it should be understood that the invention can be implemented through code coupled to a computer, e.g., code resident on a computer or accessible by the computer. For example, software and databases could be utilized to implement many of the methods discussed above. Thus, in addition to embodiments where the invention is accomplished by hardware, it is also noted that these embodiments can be accomplished through the use of an article of manufacture comprised of a computer usable medium having a computer readable program code embodied therein, which causes the enablement of the functions disclosed in this description. Therefore, it is desired that embodiments of the invention also be considered protected by this patent in their program code means as well. Furthermore, the embodiments of the invention may be embodied as code stored in a computer-readable memory of virtually any kind including, without limitation, RAM, ROM, magnetic media, optical media, or magneto-optical media. Even more generally, the embodiments of the invention could be implemented in software, or in hardware, or any combination thereof including, but not limited to, software running on a general purpose processor, microcode, PLAs, or ASICs.

It is also envisioned that embodiments of the invention could be accomplished as computer signals embodied in a carrier wave, as well as signals (e.g., electrical and optical) propagated through a transmission medium. Thus, the various information discussed above could be formatted in a structure, such as a data structure, and transmitted as an electrical signal through a transmission medium or stored on a computer readable medium.

It is also noted that many of the structures, materials, and acts recited herein can be recited as means for performing a function or step for performing a function. Therefore, it should be understood that such language is entitled to cover all such structures, materials, or acts disclosed within this specification and their equivalents, including the matter incorporated by reference.

It is thought that the apparatuses and methods of embodiments of the present invention and its attendant advantages will be understood from this specification. While the above description is a complete description of specific embodiments of the invention, the above description should not be taken as limiting the scope of the invention as defined by the claims.

In addition to embodiments where the invention is accomplished by hardware, it is also noted that these embodiments can be accomplished through the use of an article of manufacture comprised of a computer usable medium having a computer readable program code embodied therein, which causes the enablement of the functions and/or fabrication of the hardware disclosed in this specification. For example, this might be accomplished through the use of hardware description language (HDL), register transfer language (RTL), VERILOG, VHDL, or similar programming tools, as one of ordinary skill in the art would understand. The book "A Verilog HDL Primer" by J. Bhasker, Star Galaxy Pr., 1997 provides greater detail on Verilog and HDL and is hereby incorporated by reference for all that it discloses for all purposes. It is therefore envisioned that the functions accomplished by embodiments of the invention as described above could be represented in a core which could be utilized in programming code and transformed to hardware as part of the production of integrated circuits. Therefore, it is desired that the embodiments expressed above also be considered protected by this patent in their program code means as well.

What is claimed is:

1. An integrated circuit comprising:
   a first input terminal for receiving an input testing signal during operation;
   a plurality of input/output terminals coupled with said first input terminal; wherein said input/output terminals are configured to fan-out the input testing signal in parallel as respective output testing signals, during parallel output operation;
   wherein said input/output terminals are configured to parallel input testing response signals during parallel input operation from devices under test; and
   wherein each of said input/output terminals is electrically isolated during operation from the remaining plurality of input/output terminals.

2. The integrated circuit as claimed in claim 1, wherein said input/output terminals are electrically isolated by active components during operation from the remaining plurality of input/output terminals.

3. The integrated circuit as claimed in claim 2 and further comprising a plurality of active drivers, each of said active drivers coupling one of said plurality of input/output terminals to said first input terminal.

4. The integrated circuit as claimed in claim 1 and further comprising: a storage device coupled with said plurality of input/output terminals for storing said testing response signals as stored testing response signals.

5. The integrated circuit as claimed in claim 4 and further comprising: a serial output circuit coupled with said storage device and coupled with said first input terminal for serially outputting said stored testing response signals via said first input terminal.

6. The integrated circuit as claimed in claim 1 and further comprising:
   a plurality of parametric measuring circuits, each of said parametric measuring circuits for use with one of said input/output terminals, wherein said plurality of parametric measuring circuits are configured to allow independent parametric measurement at one of said plurality of input/output terminals during operation while isolated from the remaining plurality of input/output terminals.

7. The integrated circuit as claimed in claim 1 wherein said plurality of input/output terminals are configurable for non-parallel operation.

8. The integrated circuit as claimed in claim 1 and further comprising: an error signal storage device for storing individual error signals for said devices under test.

9. The integrated circuit as claimed in claim herein said parallel input occurs without an increase in test time overhead.

10. The integrated circuit as claimed in claim 1 wherein said parallel input provides a timing accuracy of lens than about 300 picoseconds.

11. The integrated circuit as claimed in claim 1 and further comprising a second input terminal.

12. The integrated circuit as claimed in claim 11 and further comprising a second plurality of input/output terminals coupled with said second input terminal.

13. The integrated circuit as claimed in claim 1 and further comprising: a bypass circuit configured to couple said first input terminal with only one of said input/output terminals while isolating said remaining input/output terminals from said first input terminal.

14. The integrated circuit as claimed in claim 1 wherein said devices under test are low power devices without the ability to drive a signal over a wire having a length of more than 10 inches.

15. The integrated circuit as claimed in claim 1 wherein each of said input/output terminals is coupled to a respective input driver configured to drive signals received from a device under test.

* * * * *